(12) United States Patent
Zecharia et al.

(10) Patent No.: US 9,281,053 B2
(45) Date of Patent: Mar. 8, 2016

(54) MEMORY SYSTEM AND AN APPARATUS

(71) Applicant: Huawei Technologies Co., Ltd., Shenzhen, Guangdong (CN)

(72) Inventors: Rami Zecharia, Munich (DE); Yaron Shachar, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 76 days.

(21) Appl. No.: 14/198,195

(22) Filed: Mar. 5, 2014

(65) Prior Publication Data

US 2014/0185368 A1 Jul. 3, 2014

Related U.S. Application Data

(63) Continuation of application No. PCT/CN2011/079329, filed on Sep. 5, 2011.

(51) Int. Cl.
| | |
|---|---|
| *G11C 11/00* | (2006.01) |
| *G11C 11/413* | (2006.01) |
| *G06F 12/02* | (2006.01) |
| *G06F 13/16* | (2006.01) |
| *H04L 12/933* | (2013.01) |

(Continued)

(52) U.S. Cl.
CPC ............ *G11C 11/413* (2013.01); *G06F 12/023* (2013.01); *G06F 13/1684* (2013.01); *H04L 49/10* (2013.01); *H04L 49/90* (2013.01); *G06F 12/06* (2013.01); *G06F 2212/2532* (2013.01)

(58) Field of Classification Search
CPC .... G11C 7/22; G11C 29/26; G11C 11/40603; G11C 11/413; G06F 12/06; G06F 12/023; G06F 12/0802; G06F 2212/1044; H04L 49/10
USPC .................. 365/154, 189.11, 189.14–189.16, 365/230.03, 230.05; 327/19; 711/128, 155
See application file for complete search history.

(56) References Cited

U.S. PATENT DOCUMENTS

| | | | | |
|---|---|---|---|---|
| 5,495,190 A | * | 2/1996 | Abe et al. .................... | 327/19 |
| 6,657,955 B1 | | 12/2003 | Bonneau et al. | |

(Continued)

FOREIGN PATENT DOCUMENTS

| | | |
|---|---|---|
| CN | 1677958 A | 10/2005 |
| EP | 0374337 A1 | 6/1990 |

(Continued)

OTHER PUBLICATIONS

Tanaka, "A Multiport Page-Memory Architecture and a Multiport Disk-Cache System," New Generation Computing, vol. 2, pp. 241-260, Ohmsha, Ltd., Tokyo, Japan (1984).

*Primary Examiner* — David Lam
(74) *Attorney, Agent, or Firm* — Leydig, Voit & Mayer, Ltd.

(57) ABSTRACT

A memory system (1) comprising a control logic (2) adapted to receive a number n of write requests (WRs) from input ports and to receive a read request (RR) from an output port within a clock cycle of a clock signal (CLK) applied to said memory system (1), wherein n is a natural number; and n+1 memory banks (4) of a shared memory (3) adapted to store data, wherein the control logic (2) is adapted to control a memory bank occupancy level MBOL of each memory bank (4) such that the differences between memory bank occupancy levels MBOLs of the memory banks (4) are minimized.

16 Claims, 10 Drawing Sheets

(51) Int. Cl.
  *H04L 12/861* (2013.01)
  *G06F 12/06* (2006.01)

(56) References Cited

U.S. PATENT DOCUMENTS 7,594,048 B1    9/2009  Edwards et al.
8,374,050 B2 *  2/2013  Zhou et al. .............. 365/230.05
8,677,072 B2 *  3/2014  Iyer et al. ...................... 711/141
2005/0213571 A1  9/2005  Barrack et al.
2011/0113200 A1  5/2011  Moses et al.

FOREIGN PATENT DOCUMENTS

WO    8001421  A1    7/1980
WO    0135419  A1    5/2001

* cited by examiner

MEMORY SYSTEM AND AN APPARATUS

CROSS-REFERENCE TO RELATED APPLICATIONS

This application is a continuation of International Patent Application No. PCT/CN2011/079329, filed on Sep. 5, 2011, which is hereby incorporated by reference in its entirety.

TECHNICAL BACKGROUND

The invention relates to a method and apparatus for storing efficiently data by a memory system of an apparatus having ports and in particular by a memory system of a high speed switching device.

High speed, multi-port memory systems are required in many applications, specifically memory systems with a single read port and multiple write ports where all ports can be operational simultaneously. Examples for these applications, but not limited to, are queuing engines as part of switching systems in the networking area or central processing units CPUs in multi-core environments.

Conventional designs of memory systems mainly use single-port or dual-port memories. The single-port memory can be accessed at one address at a time. Accordingly, one read/write operation can be performed for one memory cell during each clock cycle. The dual-port memory has the ability to simultaneously read and write different memory cells at different addresses. However, the dual-port RAM typically consume a silicon area that is in the order of a factor two larger than the area occupied by a single-port RAM of the same memory size. Multi-port memories can be built by replicating data into few individual single or dual-port memories. However, replication of data in memories requires the usage of bigger memories, hence spending more silicon area and higher power than the case where the data is stored only once.

FIG. 1 shows a conventional switch within a network system wherein the switch has a predetermined number n of ports. Each port of the conventional switch shown in FIG. 1 is bidirectional which means that each port has a dedicated interface to transfer data into the switch and a dedicated interface to transfer data out of the switch as illustrated by FIG. 1.

There are many different conventional architectures to built a switching system as shown in FIG. 1 as illustrated by FIGS. 2 to 4.

FIG. 2 shows a conventional time-division multiplexing TDM switching system of the shared memory. In this conventional arrangement data traffic from all input ports is broken into chunks of data. The data chunks are delivered from the input ports to a shared memory using a Time-Division Multiplexing (TDM) method. Chunks of data are delivered to the output ports from the shared memory by a decision or scheduler block as illustrated in FIG. 2. This scheduler can employ various algorithms such as a round-robin, a weighted-round-robin or a priority algorithm.

A limitation of the conventional arrangement as shown in FIG. 2 is that the shared memory between the multiplexing unit and the de-multiplexing unit as shown in FIG. 2 is required to support a bandwidth which is n "port bandwidth", wherein n is the number of the ports. This poses limitations on the implementation of the shared memory as it needs to support a very high bandwidth and therefore usually needs to operate at a very high frequency relative to the port rate.

FIG. 3 shows a further conventional arrangement, wherein the switching system as shown in FIG. 1 uses a cross bar. In this conventional arrangement a grid as illustrated in FIG. 3 is provided. By means of the cross bar or grid each input can be connected to each output. Data traffic from all input ports is broken to chunks of data. These chunks are stored in each source port using input queues prior to delivery to the proper output ports. Once a scheduler decides to deliver traffic such as a chunk of data from a specific input port to a specific output port, it opens the exact point in the grid as shown in FIG. 3 to allow this data traffic. The disadvantage of the conventional memory system using a cross bar as illustrated in FIG. 3 is that the scheduler is relatively complex and needs to perform a match between the input ports to the output port to maximize the delivery between inputs and outputs at each switching cycle.

A further conventional arrangement is shown in FIG. 4. FIG. 4 shows a CLOS based switching system which can contain three or more switching levels. Each switching level contains many small switches that can be implemented using any of the above conventional arrangements as shown in FIGS. 2, 3. Conventional CLOS based switching system as shown in FIG. 4 generates other problems such as out of order of traffic delivery to the destination ports. Further the conventional CLOS based switching system is quite complex and difficult to implement.

Most of the single switching devices employ a time-division multiplexing TDM scheme with a shared memory as illustrated in FIG. 2. However, this poses a limitation to the total bandwidth of a single device using this technology as the shared memory is required to support at least double the bandwidth since, at most, all ports are writing to the memory and all ports are reading from the memory at the same time.

As technology is reaching the high frequency barrier in VLSI design or even in PCB boards there is a need for memory systems and methods which allow to meet bandwidth requirements and the amount of required accesses of the memory system without increasing the frequency beyond the technological limit.

SUMMARY OF THE INVENTION

A goal of the present invention is to provide a method and an apparatus for storing efficiently data to meet high bandwidth requirements without increasing the operation frequency beyond the technological limit, achieving a memory system that can perform n writes and a single read simultaneously in one clock cycle.

According to a first aspect of the present invention this can be achieved by a memory system comprising a control logic adapted to receive a number n of write requests from input ports and to receive a read request from an output port within a clock cycle of a clock signal applied to said memory system, wherein n represents the number of ports; and comprising n+1 memory banks of a shared memory adapted to store data, wherein the control logic is adapted to control a memory bank occupancy level of each memory bank such that the differences between memory bank occupancy levels of the memory banks are minimized.

In a first possible implementation of the memory system according to the first aspect the control logic is adapted to distribute write requests from input ports to all available memory banks of the memory system according to a predetermined association function to achieve a uniform distribution of write accesses to the memory banks.

In a second possible implementation of the first possible implementation of the memory system according to the first aspect of the present invention write requests from the input ports are distributed to all available memory banks of the shared memory to maintain a uniform distribution of the memory bank occupancy levels of the memory banks over time.

In a third possible implementation of the first or second implementation of the memory system according to the first aspect of the present invention the control logic comprises an occupancy level counter for each memory bank to monitor the memory bank occupancy level of the respective memory bank.

In a fourth possible implementation of the third implementation of the memory system according to the first aspect of the present invention the occupancy level counter of one of the memory banks of the shared memory is incremented with each write operation of writing data into the respective memory bank in response to a write request received by the control logic from one of the input ports of the memory system.

In a fifth implementation of the third or fourth implementation of the memory system according to the first aspect of the present invention the occupancy level counter of one of the memory banks of the shared memory is decremented upon each read operation of reading data from the respective memory bank in response to a read request received by the control logic from the output port.

In a possible sixth implementation of the memory system according to the first aspect of the present invention which can form a possible implementation of the first to fifth implementation each memory bank can be formed by a single-port SRAM. This implementation allows to minimize the required area on silicon when integrating the memory system according to the first aspect of the present invention in an integrated circuit. Integration of single-port SRAMs requires a small area on silicon. There is no need to employ dual-port SRAMs which are typically almost double in size when compared to single-port SRAMs.

In a possible seventh implementation of the first to sixth implementation of the memory system according to the first aspect of the present invention the memory size of the memory system provided by the n+1 memory banks each having a predetermined maximum memory size B is given depending on whether no memory bank of the memory system is fully occupied or whether at least one memory bank is fully occupied.

In an eighth implementation of the seventh implementation of the memory system according to the first aspect of the present invention, if no memory bank of the memory system is fully occupied, then the total memory occupancy of the memory system is: MS=(n+1)*B, wherein MS is the memory size of the memory system, n+1 is the number of memory banks of the shared memory, and B is the predetermined maximum memory size of a memory bank.

In a ninth possible implementation of the seventh implementation of the memory system according to the first aspect of the present invention, if at least one memory bank is fully occupied and if the number of write requests in the current clock cycle of the clock signal is smaller or equal to the difference between the number n+1 of the memory banks and the number of memory banks ready for write being fully occupied, i.e: #(WR)≤(n+1)−# (memory banks ready for write which are full), then the total memory occupancy of the memory system is given by:

MS=(n+1)*(B−Min), wherein MS is the memory size of the memory system,
n+1 is the number of memory banks, B is the predetermined maximum memory size of a memory bank and Min is the minimum memory bank occupancy level between the non-fully occupied memory banks.

In an tenth possible implementation of the first to ninth implementations of the memory system according to the first aspect of the present invention the association function is configured to minimize the difference in occupancy of the memory banks.

In a further possible eleventh implementation of the memory system according to the first to tenth implementation of the first aspect of the present invention the association function is configured to minimize a correlation between qualifiers of data received from an input port and written into a memory bank in response to a write request received by the control logic in response to said write request.

In a further possible twelfth implementation of the eleventh implementation of the memory system according to the first aspect of the present invention the qualifiers comprise a type of data received from an input port.

In a further possible thirteenth implementation of the eleventh implementation of the memory system according to the first aspect of the present invention the qualifiers comprise a class of data received from an input port.

In a further possible fourteenth implementation of the first to thirteenth implementation of the memory system according to the first aspect of the present invention the association function used by the control logic comprises a random association function.

In a further possible fifteenth implementation being an implementation of the fourteenth implementation of the memory system according to the first aspect of the present invention the control logic is adapted to sort all available memory banks for writing data into the memory banks based on their memory bank occupancy levels and to associate the write requests received by the control logic in a random sequence to the available memory banks starting with the memory bank having the lowest memory bank occupancy level.

In a further possible sixteenth implementation being an implementation of the fifteenth implementation of the memory system according to the first aspect of the present invention the association function used by the control logic comprises a random association function with history.

In a possible seventeenth implementation being an implementation of the sixteenth implementation of the memory system according to the first aspect of the present invention the control logic is further adapted to keep a history of write requests from each input port, wherein for each write request being selected randomly a memory bank not marked in the input port's history is preferred to perform the write operation.

The above-mentioned goal is also achieved according to a second aspect of the present invention by a method for buffering efficiently data by a memory system of an apparatus having ports, comprising the steps of:

receiving a number of write requests from input ports and a read request from an output port within a clock cycle of a clock signal applied to said apparatus; and distributing the write requests to memory banks of said memory system such that the difference of memory bank occupancy levels between the memory banks is minimized.

In a first possible implementation of the method for buffering efficiently data by a memory system of an apparatus having ports according to the second aspect the distribution of the write requests to the memory banks is performed according to a predetermined association function.

The above-mentioned goal is also achieved according to a third aspect of the present invention by an apparatus comprising a predetermined number of ports and a memory system according to one of the implementations of the memory system according to the first aspect of the present invention.

In a first implementation of the apparatus according to the third aspect of the present invention the apparatus comprises a network bridge.

In a second implementation of the apparatus according to the third aspect of the present invention the apparatus comprises a network switch.

In a third implementation of the apparatus according to the third aspect of the present invention the apparatus comprises a network router.

In a forth implementation of the apparatus according to the third aspect of the present invention the apparatus comprises a queuing engine.

BRIEF DESCRIPTION OF THE FIGURES

In the following possible embodiments of the memory system and the method for buffering efficiently data by a memory system of an apparatus having ports and of an apparatus comprising a predetermined number of ports and a memory system according to the first, second and third aspect of the present invention are described with reference to the enclosed figures.

DETAILED DESCRIPTION OF EMBODIMENTS

Figure 5:
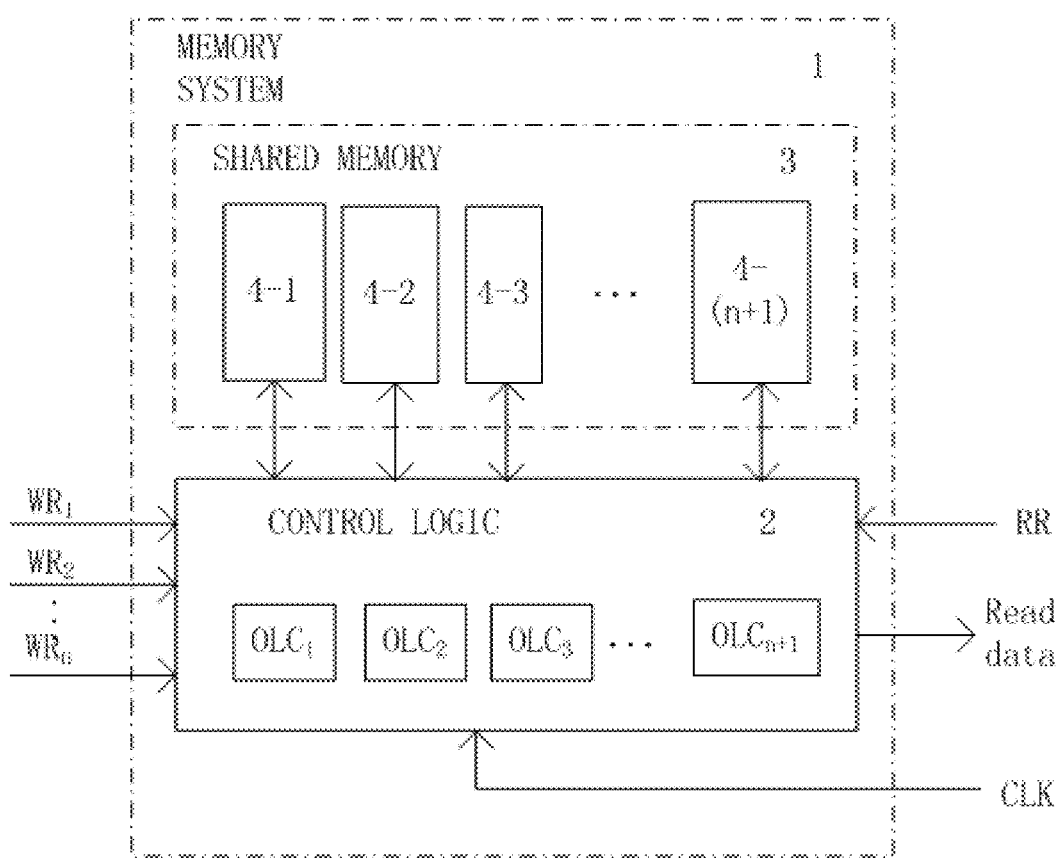
FIG. 5 shows a block diagram of a possible implementation of a memory system according to a first aspect of the present invention.

As can be seen from FIG. 5 showing a possible implementation of a memory system 1 according to a first aspect of the present invention the memory system 1 comprises a control logic 2 and a shared memory 3. The shared memory 3 comprises a predetermined number n+1 of memory banks 4-1, 4-2, 4-3 . . . 4-(n+1) as illustrated in FIG. 5. The shared memory 3 is adapted to store data. The shared memory 3 comprises in the shown implementation of FIG. 5 n+1 memory banks 4-$i$. As can be seen from FIG. 5 the control logic 2 has individual access to each memory bank 4-$i$ of the shared memory 3. The control logic 2 is adapted to control a memory bank occupancy level MBOL of each memory bank 4-$i$ within the shared memory 3. As can be seen in FIG. 5 the control logic 2 is adapted to receive a number n of write requests WRs from input ports and to receive a read request RR from an output port within a clock cycle of a clock signal CLK applied to the memory system 1. The control logic 2 is adapted to control a memory bank occupancy level MBOL of each memory bank 4-$i$ of the shared memory 3 such that the differences between memory bank occupancy levels MBOLs of the memory banks 4-$i$ are minimized. In the implementation shown in FIG. 5 the control logic 2 comprises an occupancy level counter $OLC_i$ for each memory bank 4-$i$ to monitor the memory bank occupancy level MBOL of the respective memory bank 4-$i$. In the implementation shown in FIG. 5 the different occupancy level counters OLCs are integrated in the control logic 2. In an alternative embodiment the control logic 2 has access to external occupancy level counters OLC via interfaces. In a possible implementation of the memory system 1 as shown in FIG. 5 the control logic 2 is adapted to distribute write requests WRs from input ports to all available memory banks 4-$i$ of said memory system 1 according to a predetermined association function AF to achieve a uniform distribution of write accesses to the memory banks 4-$i$ within the shared memory 3. In a possible implementation the write requests WRs from the input ports are distributed to all available memory banks 4-$i$ of the shared memory 3 to maintain a uniform distribution of the memory bank occupancy levels MBOLs of the memory banks 4-$i$ of the shared memory 3 over time. The occupancy level counter $OLC_i$ of one memory bank 4-$i$ of the shared memory 3 is incremented in a possible implementation of the memory system 1 with each write operation of writing data into the respective memory bank 4-$i$ in response to a write request WR received by the control logic 2 from one of the input ports of the memory system 1. In a further possible implementation the occupancy level counter $OLC_i$ of one of the memory banks 4-$i$ of the shared memory 3 is decremented upon each read operation of reading data from the respective memory bank 4-$i$ in response to a read request RR received by the control logic 2 from the output port.

In a possible first implementation the embodiment of the memory system 1 as shown in FIG. 5 each memory bank 4-$i$ of shared memory 3 is formed by a single-port SRAM. The implementation has the advantage that single-port SRAMs do not need much area when integrated on a chip. Further, single-port SRAMs, have a low power consumption and can operate at a low frequency to achieve a required memory access bandwidth. The use of single-port SRAMs allows for a minimal area when integrating the memory system 1 shown in FIG. 5 in a chip.

In an alternative implementation the shared memory 3 of the memory system 1 according to the first aspect of the present invention can also comprise dual-port memories. In this implementation the memory banks 4-$i$ to 4-(n+1) are formed by dual-port SRAM blocks. In a still further possible implementation the shared memory 3 can comprise a mix or a combination of single or dual-port memory banks 4-$i$.

In a possible implementation of the memory system 1 as shown in FIG. 5 the shared memory 3 can comprise replaceable memory banks 4-i. In this implementation a memory bank 4-i can be exchanged easily by replacing the respective memory bank. In an alternative implementation the shared memory 3 forms an integral unit and comprises n+1 memory banks 4-1 to 4-(n+1) and only the complete shared memory 3 can be substituted or replaced.

In a possible implementation of the memory system 1 as shown in FIG. 5 the shared memory 3 and the control logic 2 can be formed by separate entities, for example separate chips or all compromising a complete system in a single chip. In a still further possible implementation the complete memory system 1 is formed by an integrated chip comprising the control logic 2 as well as the shared memory 3.

In a possible embodiment of the memory system 1 according to the first aspect of the present invention the memory size MS of the memory system 1 provided by the n+1 memory banks 4-i of the shared memory 3 each having a predetermined maximum memory size B does depend on whether no memory bank 4-i of the memory system 1 is fully occupied or whether at least one memory bank 4-i of the memory system 1 is fully occupied.

If no memory bank 4-i of the memory system 1 is fully occupied, then the total memory occupancy MS of the memory system 1 is:

$$MS=(n+1)*B,$$

wherein n+1 is the number of the memory banks 4-i of the shared memory 3 and B is the memory size of each individual memory bank 4-i.

If at least one memory bank 4-i of the shared memory 3 is fully occupied and if the number of write requests WRs in the current clock cycle of the applied clock signal CLK is smaller or equal to the difference between the number n+1 of memory banks 4-i of the shared memory 3 and the number of memory banks 4-i ready for write being fully occupied:

(WR)≤(n+1)−# (memory banks ready for write which are full), then the total memory occupancy MS of the memory system 1 is:

$$MS=(n+1)*(B-\mathrm{Min}),$$

wherein Min is the minimum memory bank occupancy level MBOL between the non-fully occupied memory banks 4-i of the memory system 1.

In an implementation of the memory system 1 according to the first aspect of the present invention the control logic 2 receives a number n of write requests WRs from input ports of an apparatus comprising a memory system 1. Each memory bank 4-i comprises a predetermined number of addressable memory cells. Each write request WR comprises in a possible implementation a corresponding write address for data to be written into a memory cell. The write requests WRs from the input ports are distributed by the control logic 2 to all available memory banks 4-i of the shared memory 3 to maintain a uniform distribution of the memory bank occupancy levels MBOLs of the memory banks 4-i over time. The control logic 2 is adapted to control the memory bank occupancy level MBOL of each memory bank 4-i as indicated for example by a corresponding occupancy level counter OLC of the memory bank 4-i such that the differences between the memory bank occupancy levels MBOLs of the memory banks 4-i within the shared memory 3 are minimized. The control logic 2 is adapted to receive a read request RR from an output port in the clock cycle of the applied clock signal CLK. The read request RR can comprise a read address to read data from a memory cell. The read request RR is supplied to read data from a specific memory cell within the shared memory 3. A read access is performed by the control logic 2 for the provided read address. This means that the memory bank 4-i from which the data is read is not selected for a write operation within the same clock cycle. The memory system 1 according to the first aspect of the present invention performs either no or one read access per clock cycle. There can be 0 to n write accesses per clock cycle.

In a possible implementation the control logic 2 of the memory system 2 selects as a first priority the memory bank for a mandatory read access if a read request RR is applied to the control logic 2. As a second priority the control logic 2 selects memory banks 4-i for the write accesses when required. The control logic 2 performs an operation which guarantees that in each clock cycle of the applied clock signal CLK there can be non or one read access and 0 to n write accesses where the write accesses can be performed to any memory bank which is not occupied by the read access. The control logic 2 keeps the memory banks occupancy levels MBOLs almost equal over time. This allows for a maximum utilization of the memory banks 4-i, in particular when the memory utilization of each memory bank 4-i is almost as high as its maximum, i.e. the memory size B of the individual memory bank 4-i. If the memory bank occupancy levels are not roughly equal then in case that the overall memory utilization is high, it is possible that one memory bank 4-i will be completely full while other memory banks are not. In this situation if the specific fully utilized memory bank 4-i is selected for a write access the write access to this memory bank 4-i can not be performed as the memory bank is already full. This situation can occur, for example, when the control logic 2 receives n write requests WRs in the same clock cycle of the clock signal CLK and at the same time a read request RR to read data from a memory cell within a memory bank 4-i. The control logic 2 of the memory system 1 according to the first aspect of the present invention avoids this situation where the memory system performance would be broken. In some applications it is possible to drop a write request WR, however, in many applications a write request WR cannot be dropped. To avoid such a drop of a write request WR, the shared memory 3 is considered as full if at least one memory bank 4-i of the shared memory 3 is fully occupied. For example in a situation where the memory system 1 receives n write requests WRs and in case that one memory bank 4-i is already fully occupied there are (n+1)−1=n operational memory banks left, so that the n write requests WRs can still be distributed to that n different memory banks 4-i in the same clock cycle. If in this example a further memory bank 4-i becomes fully occupied only n−1 memory banks are left for a write access so that when the control logic 2 receives in the next clock cycle n write requests from the input ports a distribution of the n write requests WRs to different memory banks at the same time within this clock cycle is no longer possible.

The shared memory 3 of the memory system 1 according to the first aspect of the present invention comprises n+1 memory banks 4-i. To guarantee one read access in response to a read request RR within a clock cycle of the clock signal CLK only n memory banks 4-i are left for distributing write accesses in response to write requests WRs. Accordingly, if only one memory bank 4-i of the remaining n memory banks 4-i is completely occupied the shared memory 3 is to be considered as full by the control logic 2 since a distribution of n write accesses in response to n write requests WRs from the input ports is no longer possible for the control logic 2. To avoid this situation as long as possible, the control logic 2 distributes the write requests WRs from the input ports to all available memory banks 4-$i$ of the shared memory 3 to maintain a uniform distribution of the memory bank occupancy levels MBOLs of memory banks 4-$i$ over time. The differences between the memory bank occupancy levels MBOLs of the memory banks are kept at a minimum by the control logic 2. A minimization of the difference between memory banks' occupancy levels MOBLs is achieved so that roughly the same memory occupancy per memory bank 4-$i$ is maintained by the control logic 2 at all times. To maintain a roughly equal memory bank occupancy level MOBL of the memory banks 4-$i$ the control logic 2 distributes the write requests WRs from all write ports to all memory banks 4-$i$ such that the distribution of the occupancy level of the memory banks is as uniform as possible.

In a possible embodiment if a read access to a memory bank 4-$i$ is required in response to a read request RR received by the control logic 2, the control logic 2 selects a memory bank 4-$i$ for the read access based on the received read address. In a further step the control logic 2 removes this selected memory bank 4-$i$ from possible memory banks for performing a write access in the same clock cycle. In a possible embodiment the control logic 2 distributes the write accesses in response to write requests WRs from the input ports to all still available memory banks 4-$i$ of the shared memory 3 according to a predetermined association function AF.

Figure 6:
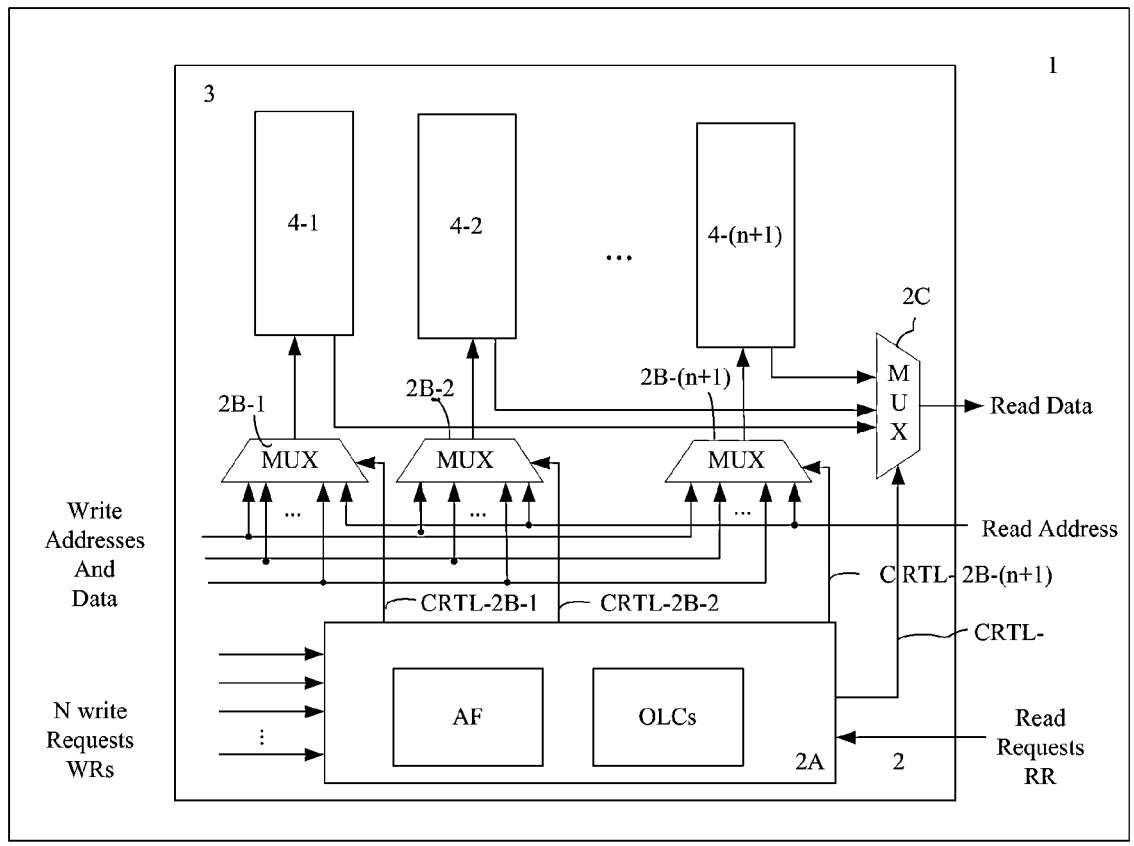
FIG. 6 shows a further block diagram of a further possible implementation of a memory system according to the first aspect of the present invention.

FIG. 6 shows a more detailed presentation of FIG. 5. The shown multiplexers 2B, 2C form part of the control logic 2.

FIG. 6 shows a possible implementation of a memory system 1 according to the first aspect of the present invention comprising a control logic core 2A within the control logic 2 having occupancy level counters OLCs and a data storage for storing an association function AF. In an alternative implementation the control logic 2 has access to read out an association function AF via an interface. In the implementation shown in FIG. 6 the control logic core 2A controls multiplexing devices 2B for performing multiplexing of write accesses to the memory banks 4-$i$ of the shared memory 3. As can be seen in FIG. 6 for each memory bank 4-$i$ a corresponding multiplexer 2B-$i$ is provided to write data into a memory cell of the respective memory bank 4-$i$ according to write addresses and data or to apply a read address of a memory cell for reading data from the addresses memory cell under the control of the control logic core 2A of the control logic 2. The control logic core 2A applies control signals CRTL-B-1; CRTL-B-2; . . . CRTL-B-(n+1) to the multiplexers 2B-1; 2B-2; . . . ; 2B-(n+1) as shown in FIG. 6. Further, the control logic 2 comprises a read multiplexer 2C for reading data from an addressed memory cell of a memory bank 4-$i$, wherein the read multiplexer 2C is controlled by a read control signal CRTL-2C applied by the control logic core 2A of the control logic 2. In a possible implementation the association function AF is configured to minimize a correlation between the input ports receiving the write requests WRs and the memory banks 4-$i$ controlled by the control logic 2 in response to that write requests WRs. The association function AF can comprise a matching algorithm between the write requests WRs, the write ports and the available memory banks 4-$i$ to which data can be written. In a possible implementation the association function AF is adapted to achieve a uniform distribution of write accesses of the memory banks 4-$i$ of the shared memory 3. Further, the association function AF can be adapted to minimize the correlation between the write ports to any memory bank 4-$i$ of the shared memory 3.

In a still further implementation the association function AF is adapted to minimize a correlation between qualifiers of data from a specific write port to any memory bank 4-$i$. In a further implementation the association function AF is configured to minimize a correlation between qualifiers of data received from an input port and written into a memory bank 4-$i$ in response to a write request WR received by the control logic 2 in response to the write request WR. The qualifier can comprise a type of data received from an input port. The qualifier can comprise also a class of data received from an input port. Examples for qualifiers are COS (Class of Service), Color, Queue or Unicast/Multicast. The qualifier can be formed by a flag within a header of a received data packet. In an embodiment the qualifier can be calculated from a rate of the incoming data packets. This calculation can be performed, for example, by a processing unit. For example, a qualifier can be a color or a flag having different values such as red, yellow or green (similar to a traffic light).

The qualifier can be calculated, for example, on the basis of the data rate of the incoming data packets. For example, if the traffic rate is beyond a first threshold value the color of the data packet is "red", and if the traffic rate is between a second and the first threshold value, the color of the data packet might be, for example, "yellow" and if the traffic rate is less than the second threshold value, the color of the data packet might be "green". In a possible implementation the association function AF is configured to minimize the correlation between the respective qualifier of the data packets received from an input write port and the memory bank 4-$i$ in which data is written in response to a write request WR received by the control logic 2 from said write port.

The association function AF is in a possible implementation adapted to minimize the difference in the occupancy level between the memory banks 4-$i$ at all times. There are different possible implementations with different association functions AFs.

In a possible implementation of the memory system 1 according to the first aspect of the present invention the control logic 2 shown in the embodiment of FIG. 6 comprises a random association function. In an implementation the control logic 2 is adapted to sort all available memory banks 4-$i$ for writing data into the memory banks 4-$i$ based on their memory banks occupancy levels MBOLs and to randomly associate the write requests WRs received by the control logic 2 to the available memory banks 4-$i$ starting with the memory bank having the lowest memory bank occupancy level MBOL.

This random association can be performed in a specific implementation as follows: In a first step all available memory banks 4-$i$ for a write access are sorted based on their memory bank occupancy level MBOL starting from the least occupied memory bank to the most occupied memory bank. If no read access is required at that time, all n+1 memory banks 4-$i$ of the shared memory 3 are sorted. In a further step, an association between the write requests WRs to the available memory banks 4-$i$ is performed starting from the least occupied memory bank, i.e. the memory bank having the lowest memory bank occupancy level MBOL.

If there are n write requests WRs and a read request RR all (n+1) memory banks have to be accessed. A specific selected memory bank for performing the read access is removed from the list of available memory banks being still available for a write accesses. A random association is performed between the still available memory banks 4-$i$ and the write requests WRs.

If there are less than n simultaneous write requests WRs for write accesses or if there are n write requests WRs and no read requests RR, there are some memory banks 4-$i$ that are not selected to be accessed for a write operation. These memory banks 4-*i* are the memory banks being most occupied with data. A random association is performed between the selected memory banks and the write requests WRs. To perform the random association, the control logic 2 can use any mechanism able to generate a random or pseudo-random number for the purpose of matching memory banks to specific write ports.

Pseudo-random numbers can be generated in a possible implementation by a Pseudo Random Binary Sequence (PRBS) function, any Cyclic Redundancy Check (CRC) or any HASH function on any given input. In a possible implementation of the memory system 1 the control logic 2 can comprise an integrated random number generator or pseudo-random number generator. In an alternative implementation the control logic 2 has access to receive a random number from a random number generator or pseudo-random number generator via an interface.

In a still further possible implementation of the memory system 1 according to the first aspect of the present invention, the association function AF used by the control logic 2 comprises a random association function with history. In this implementation the control logic 2 is further adapted to keep a history of write requests WRs from each input port. The history can comprise a sliding window of accesses. The last k write accesses are kept for each port. In a specific implementation the random association with history can be performed by the control logic 2 as follows: A history of write requests WRs per each write port is kept by the control logic 2. This history is used as a sliding window of memory accesses. In a possible implementation the last k write accesses are kept for each write port. The value of k can be 1 to n. The selection of k depends on the accuracy required to be achieved by the control logic 2 in terms of the difference in memory occupancy between the memory banks 4-*i* of the shared memory 3.

When a write request WR is issued from a specific write port, the preferred memory banks 4-*i* to perform the write request WR are set to be the ones not marked in the history window of that memory bank. These memory banks are listed in a priority manner from the least occupied memory bank to the most occupied memory bank.

Once all write requests WRs are associated with their preferred memory banks a matching is performed by the control logic 2. In a possible implementation the matching is performed by the control logic 2 as follows: The control logic 2 starts with write port 0 and matches it to the least occupied memory bank according to its preferred list of memory banks. The elected memory bank is removed from the available memory banks and this is repeated for the other write requests WRs.

To perform an even more fair and uniform distribution, for each clock cycle of the clock signal CLK the control logic 2 starts the matching with a different write request WR, for example, for a 4+1 memory system 1 having a shared memory 3 with 4+1 memory banks 4-*i* in a clock cycle a first match is performed in the sequence 0, 1, 2, 3 and in the next clock cycle the matching is performed in the following sequence 1, 2, 3, 0 etc.

Figure 7:
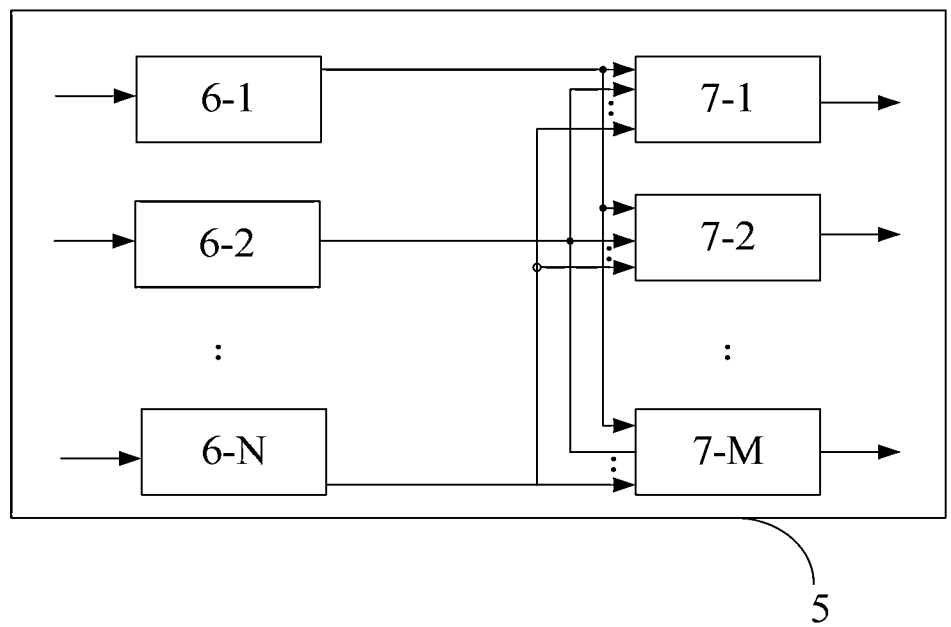
FIG. 7 shows a block diagram of a possible implementation of a high bandwidth switching device as an example for a switching device employing a memory system according to the first aspect of the present invention.

The memory system 1 according to the first aspect of the present invention as shown in the exemplary implementations of FIGS. 5, 6 can form a part of a high speed switching device a block diagram of which is shown in FIG. 7. The high speed switching device 5 can comprise N Ingress processing units 6-*i* and M Egress processing units 7-*i*. Each Ingress/Egress processing unit can support a single port or a group of ports depending on the architecture of the respective apparatus. In the exemplary embodiment of the high speed switching device 5 a MESH connection forms a connection between any Ingress processing unit 6-*i* and any Egress processing unit 7-*i*. When supporting more than one port in each Ingress/Egress processing unit, each processing unit operates, for example using a time-division multiplexing TDM and a shared memory.

In the high bandwidth switching device 5 as shown in FIG. 7 queues must be placed to store arriving data since it is possible that at the same time different input ports want to send data traffic to a specific output port. In this case some of the data traffic is sent out at the port rate while the rest of the data traffic has to be stored for later deliverance in the future. When selecting output queues each output processing block or unit contains queues for the specific output ports it supports.

Figure 8:
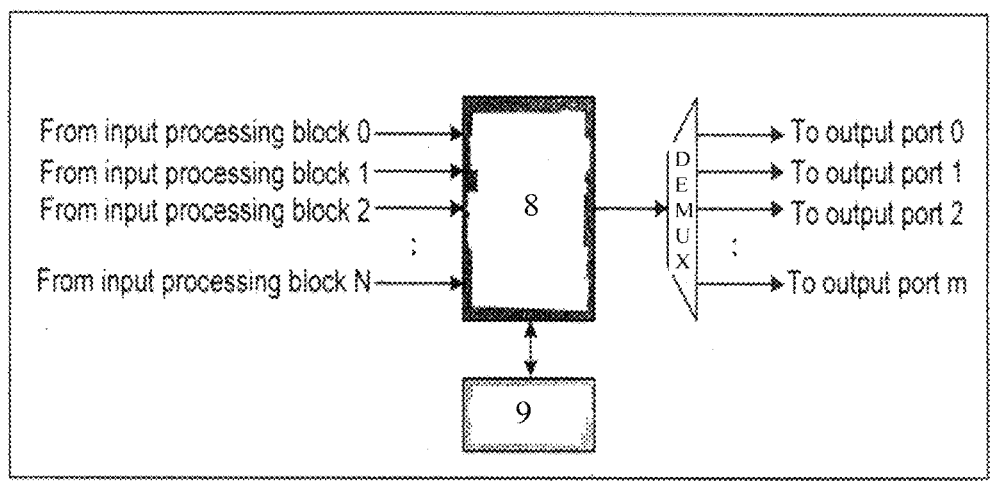
FIG. 8 shows a block diagram illustrating a queuing and scheduling of output queues as employed in the exemplary switching device of FIG. 7.

FIG. 8 shows an implementation of a queuing engine 8 and a scheduler 9 for each Egress processing unit 7-*i* within the high bandwidth switching device 5. As can be seen in FIG. 8, each Egress processing unit 7-*i* can comprise a queuing engine 8 and a scheduler 9. The scheduler 9 is connected to an En-Queue unit and De-Queue unit within the queuing engine 8. The queuing engine 8 comprises in the shown implementation N inputs, i.e. one input per each Ingress processing unit 6-*i*. Accordingly, the input bandwidth of this block is N "input block bandwidth". The output rate of this block is "output block bandwidth". If the number of the Ingress processing units 6-*i*, is equal to the number of the Egress processing units 7-*i*, then the ratio between the input and output bandwidth that the queuing engine 8 has to support is n:1.

As arriving data is broken into data chunks, where each chunk size is equal to the width of the shared memory 3, each chunk can be written to the memory system 1 in one clock cycle. The memory system 1 supports n write requests WRs and one read request RR for each clock cycle to support the required bandwidth.

Figure 9:
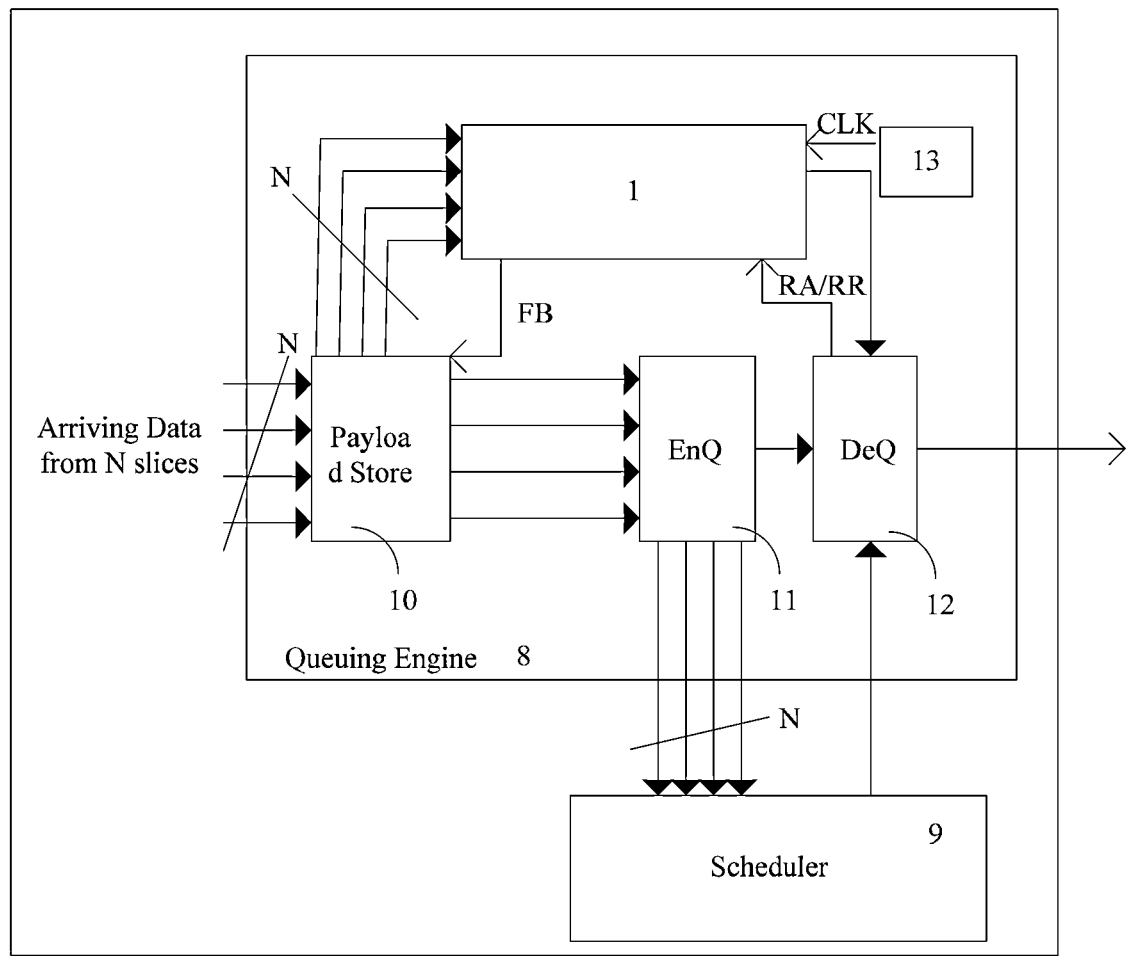
FIG. 9 shows a block diagram of a queuing engine as employed in the exemplary switching device shown in FIGS. 7, 8 having a memory system according to a first aspect of the present invention.

FIG. 9 shows a possible implementation of the queuing engine 8 comprising in the shown implementation a memory system 1 according to the first aspect of the present invention as shown, for example in the implementations of FIGS. 5, 6. In the specific implementation of the queuing engine 8 as shown in FIG. 9 the queuing engine 8 comprises a memory system 1 and a payload store 10 which matches to a En-Queue unit 11. The payload store 10 is connected in the given exemplary implementation to N=4 inputs. The output of the En-Queue unit 11 is connected to a De-Queue unit 12 as shown in FIG. 9. The En-Queue unit 11 provides an update for each of the N=4 inputs to the scheduler 9 as shown in FIG. 9. The memory system 1 receives write requests WRs from the payload store 10 and outputs the data in response to a read request RR to the De-Queue unit 12. In a possible implementation the queuing engine 8 can comprise a clock signal generator 13 for generating a clock signal CLK applied inter alia to the memory system 1.

The queuing engine 8 as shown in the implementation of FIG. 9 logically contains queues Q that store arriving data. Each output port may have in the possible implementation several queues Q each representing a different class of service of data. For example, some queues Q may be queues with high priority and a constant transmission rate containing real-time audio or video, whereas other queues Q comprise a low priority or low rate for file transfer.

N streams of arriving data from all N chunks to the payload store logic 10 are shifted to the memory system 1 to be stored. The memory system 1 provides the address to the write operations as per the distribution of the arriving traffic to the memory banks 4-*i* within the memory system 1. The write addresses such as pointers to the data can be fed back via a feedback interface FB to the payload store logic 10.

The pointers to the data, i.e. write addresses, are then stored in the proper queue Q, where a queue Q can be determined based on a classification method which is performed prior to the queuing engine 8, i.e. the data arriving to the queuing engine 8 arrives already with a queue number attached to it.

The En-Queue unit 11 is provided for storing the pointer, i.e. the address of the written data into the proper queue Q.

The De-Queue unit 12 is responsible of providing a read address RA to the memory system 1 so that data is read from a specific queue Q. At the same time the De-Queue unit 12 updates the queue database as well.

The scheduler 9 is provided for selecting a queue Q of all non-empty queues for the next read cycle based on specific algorithms such as a round-robin algorithm.

As can be seen from the exemplary implementation of the queuing engine 8 forming a processing unit of the high bandwidth switching device 5 shown in FIG. 7 the memory system 1 does support up to N write requests WRs and one read request RR for every clock cycle of the clock signal CLK.

Figure 10:
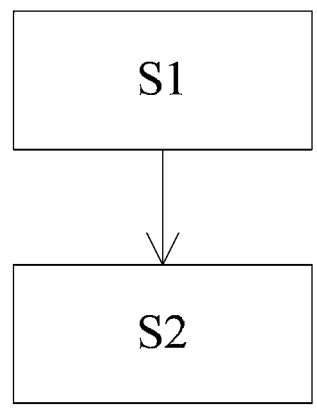
FIG. 10 shows a flow chart of a possible implementation of a method for buffering efficiently data by a memory system of an apparatus having ports according to the second aspect of the present invention.

FIG. 10 shows a flow chart of a possible implementation for a method for buffering efficiently data by a memory system of an apparatus having ports according to a second aspect of the present invention.

In a first step S1 a number of write requests WRs from input ports and a read request RR from an output port within a clock cycle of a clock signal CLK applied to the apparatus is received.

In a second step S2 the write requests WRs are distributed to memory banks 4-$i$ of the memory system 1 such that the difference of memory bank occupancy levels MBOLs between the memory banks 4-$i$ is minimized.

Figure 1:
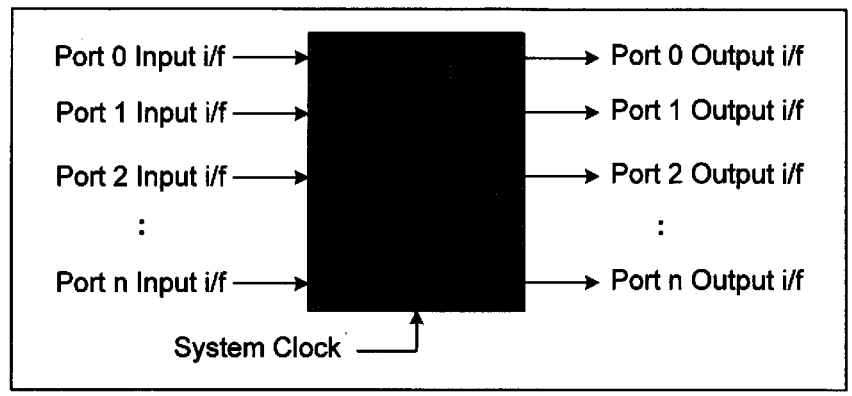
FIG. 1 shows a block diagram of a conventional switch having port interfaces.
Figure 2:
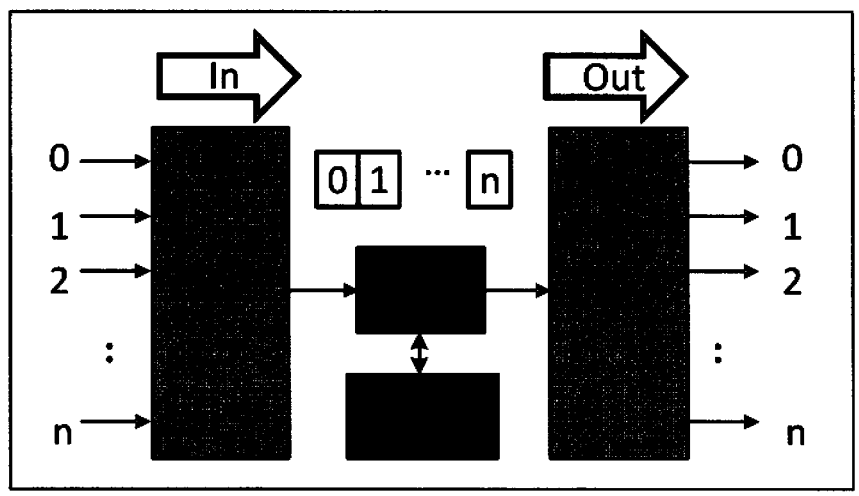
FIG. 2 shows a block diagram of a conventional time-division multiplexing TDM switching system.
Figure 3:
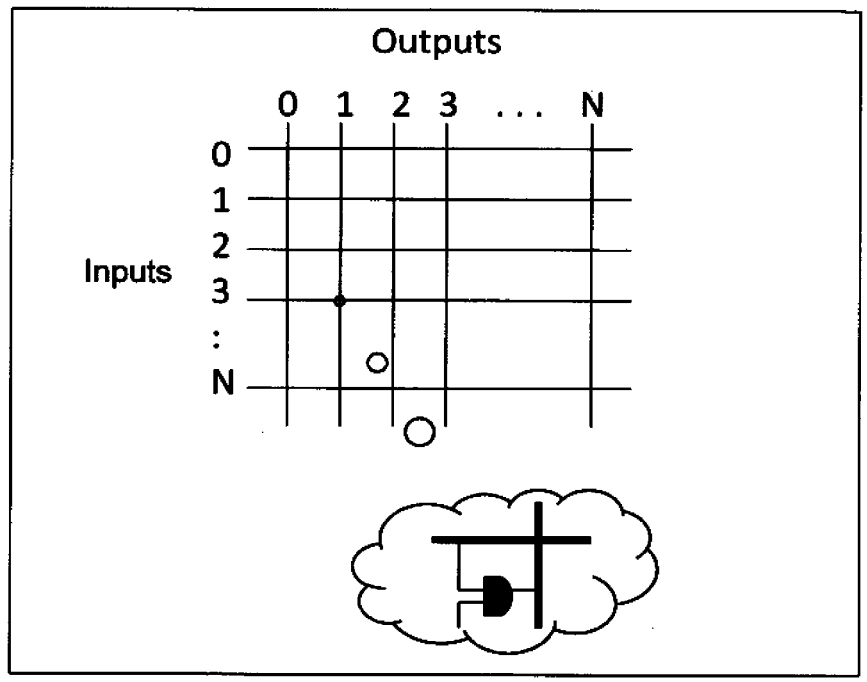
FIG. 3 shows a diagram for illustrating a conventional cross bar switching system.
Figure 4:
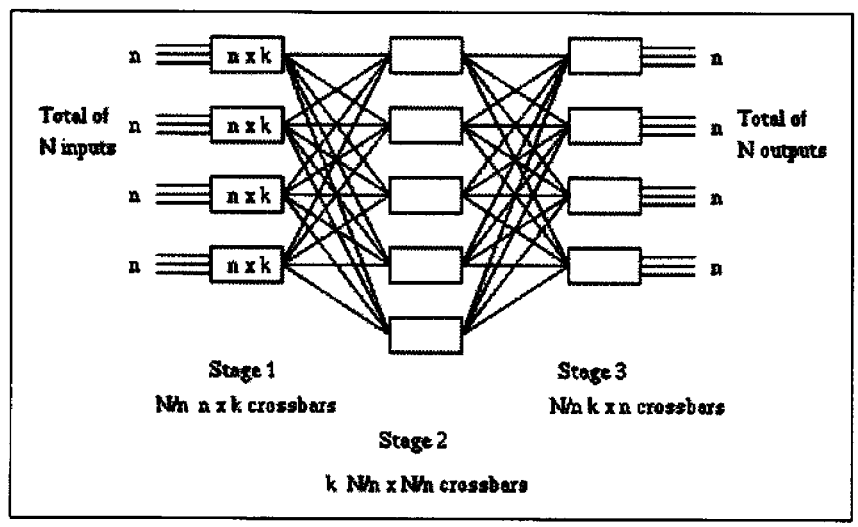
FIG. 4 shows a block diagram of a conventional CLOS based switching system.

In a possible implementation of the method as shown in FIG. 2 the distributing of the write requests WRs in step S2 to the memory banks 4-$i$ is performed according to a predetermined association function AF.

Figure 11:
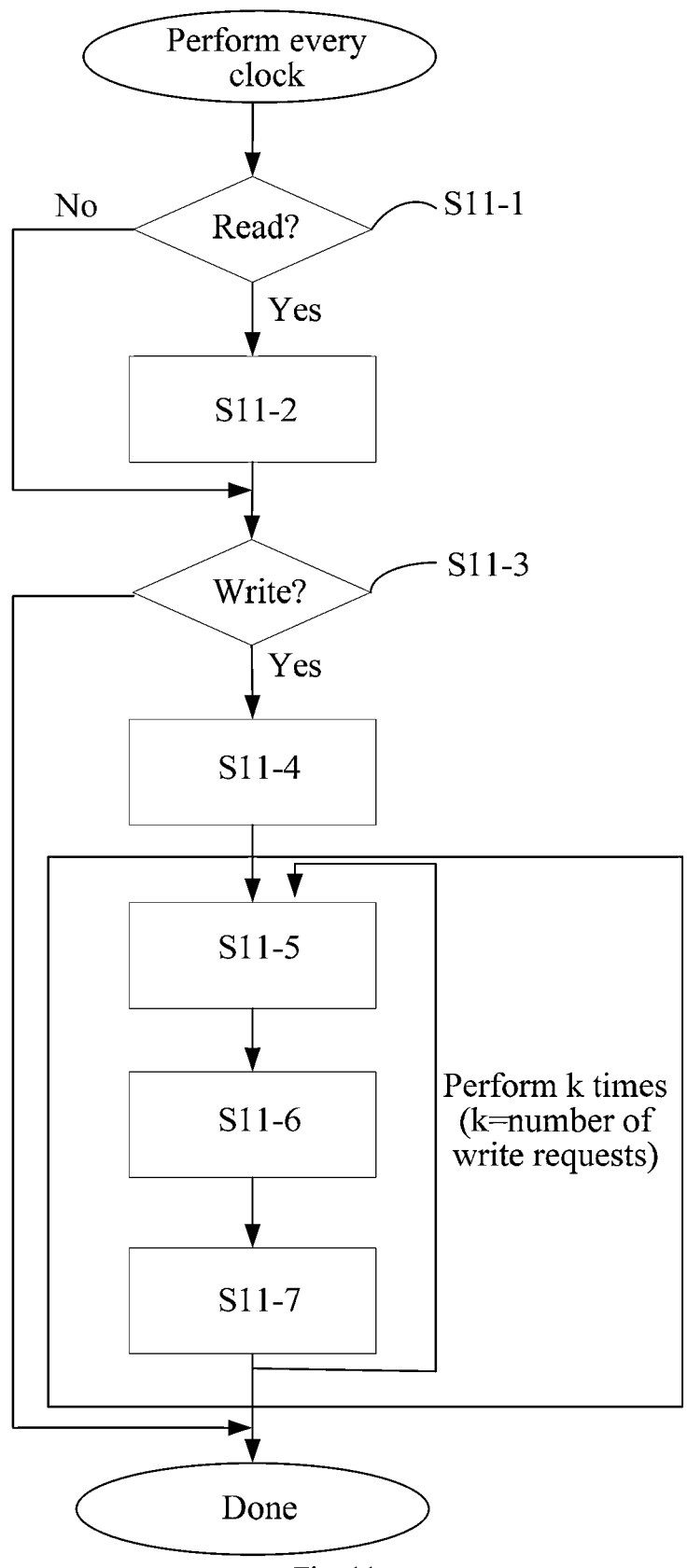
FIG. 11 shows a further flow chart illustrating a possible implementation of a method for buffering efficiently data by a memory system of an apparatus having ports according to the second aspect of the present invention using an association function.

FIG. 11 shows a possible implementation performing an association function AF as employed by the method for buffering data by a memory system of an apparatus having ports according to the second aspect of the present invention. The association function AF is a matching algorithm between the write requests WRs the available memory banks that can be written in a write access.

As can be seen in FIG. 11 at every clock cycle it is first checked in step S11-1 whether there is a read request RR for the control logic 2 of the memory system 1. If there is a read request RR, the control logic 2 selects in step S11-2 the memory bank required for performing the read operation.

Then it is checked by the control logic 2 in step S11-3 whether there are also write requests WRs. If there are write requests WRs, the control logic 2 lists in step S11-4 all available memory banks 4-$i$ not being occupied by the read access in order of memory bank occupancy. The control logic 2 sorts all available memory banks for write accesses based on their occupancy from the least occupied memory bank to the most occupied memory bank.

In a further step S11-5 the control logic 2 performs an association between the write requests WRs to the available memory banks 4-$i$ starting from the least occupied memory bank. In a further step S11-6 the selected memory bank 4-$i$ is removed from the list of possible memory banks available for write accesses in the respective clock cycle. In a further step S11-7 the selected write request WR is also removed. This is performed for all write requests WRs as illustrated in FIG. 11. The association function AF as shown in the implementation of FIG. 11 is adapted to provide a uniform distribution of write accesses to the different memory banks 4-$i$ of the shared memory 3. Further it minimizes the correlation between write ports to any memory bank 4-$i$ of the shared memory 3. The association function AF minimizes the differences of the memory occupancy levels of the memory banks 4-$i$ at all times.

Figure 12:
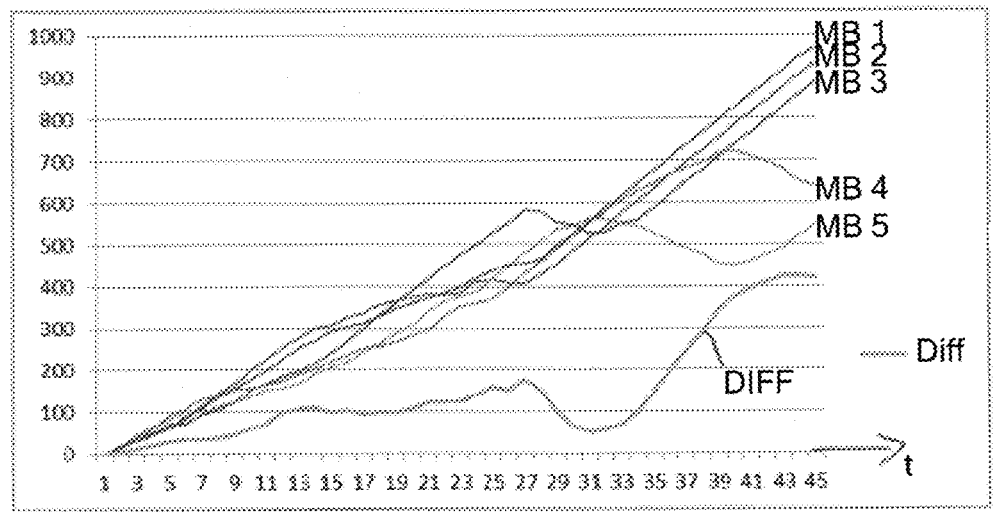
FIG. 12 shows a diagram for illustrating simulation results of a memory system with a non-random bank selection.

FIG. 12 shows a diagram for illustrating simulation results for a memory system 1 having 4+1 memory banks with non-random bank selection. The simulation is performed for a memory system 1 having four write ports and one read port. The simulation includes four write accesses and one read access for every clock cycle of the applied clock signal CLK. The simulation causes an occupancy of the memory banks 4-$i$ to grow as the write bandwidth is four times the read bandwidth. In the simulation illustrated in FIG. 12 memory banks are selected based on the write port. A match between a write port and a memory bank 4-$i$ is performed. The y-axis of the diagram shown in FIG. 12 indicates the memory occupancy level, whereas the x-axis represents time. As can be seen from FIG. 12 the difference between the occupancy levels of the memory banks 4-$i$ is high relative to the occupancy of the memory banks. The "Diff" line in the shown graph of FIG. 12 represents the difference between a maximum bank occupancy level and a minimum bank occupancy level. If, for example, the maximum bank size of a memory bank 4-$i$ comprises 800 units or memory cells, the maximum theoretical usable memory size MS is: MS=(n+1)*B. Accordingly, the memory size MS for this implementation MS=(4+1)*800 units=4000 units. Each unit is formed by a memory cell of the memory bank 4-$i$.

As can be seen from the simulation results of FIG. 12 at a memory occupancy of around 800 units the difference "Diff" between the maximum bank occupancy and the minimum bank occupancy comprises about 400 units. This reduces the actual usable memory size to around 2000 units since the actual usable memory size is given by: MS=(n+1)×(B−Min), wherein Min is the minimum memory bank occupancy level MBOL between the non-full memory banks. Consequently the actual usable memory size MS=(4+1)×(800 units−400 units)=5×400 units=2000 units. This corresponds to a loss of about 50% of the allocated memory in this specific example. FIG. 12 shows simulation results for a memory system 1 having no control unit 2 which controls the memory bank occupancy level MBOL each memory bank such that the differences between the memory bank occupancy levels MBOLs of the memory banks 4-$i$ is minimized.

Figure 13:
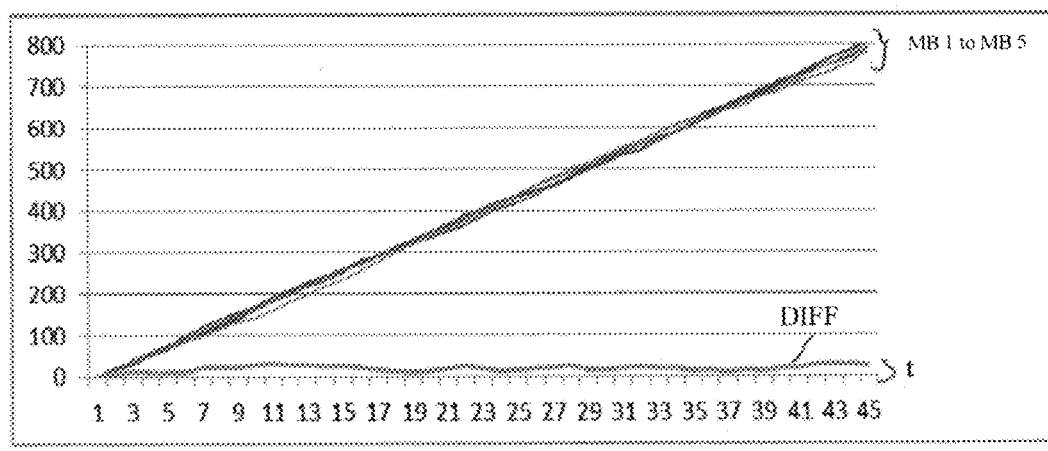
FIG. 13 shows a diagram for illustrating simulation results of a memory bank system without random bank selection.

In contrast FIG. 13 shows a diagram for illustrating simulation results of a memory system 1 having 4+1 memory banks and a control logic 2 for the control of the memory bank occupancy levels MBOLs according to a possible implementation of the memory system 1 of the first aspect of the present invention. In the shown simulation of FIG. 13 the bank selection of the write accesses has been implemented by using a random selection of the memory banks. The simulation results illustrated in FIG. 13 clearly show a great improvement of the utilization of the memory. The difference value "Diff" indicating the difference between the maximum bank occupancy and the minimum bank occupancy in the shown simulation is 20 on average. This allows for a maximum utilization of the memory to be 3900 units (B=800 units, Dif20, n+1=5). This corresponds to a loss of only 2.5% of the allocated memory of a 4+1 memory system 1 wherein each memory bank 4-$i$ has a maximum memory bank size of 800 units.

The memory system 1 according to the first aspect of the present invention and the method for buffering data according to the second aspect of the present invention allows to store data very efficiently.

The memory system 1 according to the present invention is suitable for any switch containing a queuing system. In a switch it is possible that input traffic from many ports is directed to a specific output port. As a consequence that the queue of that output port has to absorb the input traffic at a very high rate as compared to its output rate. The memory system 1 according to the present invention is capable of pushing into the memory data at a higher rate than reading data from the memory. The ratio between the input and output rate can be n:1, where the number of memory banks 4-$i$ of the memory system 1 is n+1.

The memory system 1 according to the first aspect of the present invention can be used in a wide range of apparatuses having ports. In a possible implementation memory system 1 according to the first aspect of the present invention is integrated in a network bridge. In a still further possible implementation the memory system 1 according to the first aspect of the present invention is employed within a network switch. In a still further possible implementation of the memory system 1 according to the first aspect of the present invention the memory system 1 is used in a network router. In a further possible implementation of the memory system 1 according to the first aspect of the present invention the memory system 1 forms part of a queuing engine such as the queuing engine 8 as shown in the exemplary application of FIGS. 8, 9.

A switching device employing a memory system 1 according to the present invention can be provided for switching any kind of data, in particular data packets but also continuous data traffic. In a possible implementation the switching device can comprise directional ports being operative as write ports or input ports as well as read ports or output ports. The shared memory 3 of the memory system 1 according to the first aspect of the present invention is considered as full if at least one memory bank 4-$i$ is fully occupied. In a possible implementation if at least one memory bank 4-$i$ is completely full as indicated by the respective occupancy level counter OLC of the respective memory bank 4-$i$ the control logic 2 can set a corresponding flag indicating that the shared memory 3 is full, wherein this flag can be transferred to a higher layer for further evaluation. In the implementation shown in FIG. 5 the memory system 1 comprises a control logic 2 and one shared memory 3 with n+1 memory banks 4-$i$. In a further possible implementation the control logic 2 can be connected to more than one shared memory 3. For example, the control logic 2 can be connected to the shared memory 3 as shown in FIG. 5 and also a congestion management block that can drop traffic intelligently in case of congestion, i.e.—low priority traffic can be dropped while high priority traffic is accepted to the memory system.

Further implementations and embodiments of the memory system 1 as shown in FIG. 5 are possible. For example, in a further possible implementation occupancy level counters OLCs are not implemented in the control logic 2 but in the respective memory banks 4-$i$. In this implementation the control logic 2 has access to the occupancy level counter OLC of the respective memory bank 4-$i$ within the shared memory 3 through an interface. In the implementation shown in FIG. 5 the control logic 2 gets the clock signal CLK from an external clock signal source. In an alternative implementation the control logic 2 can comprise an integrated clock signal generator for generating the clock signal CLK. In a possible implementation as shown in FIG. 6 the control logic core 2A of the control logic 2 comprises a preconfigured association function AF. In a possible implementation the association function AF can be configured or reconfigured during operation of the memory system 1 through an interface. The association function AF can be configured to minimize a correlation between qualifiers of data from an input port and a memory bank 4-$i$ in response to a write request WR received by the control logic 2 in response to the write request WR. In a possible implementation these qualifiers can also be adapted and configured via an interface. In a possible implementation the control logic 2 can comprise an execution unit executing a computer program having a program code for executing a method according to the second aspect of the present invention. The code can be stored in a program memory, in particular in a read-only memory of the control logic 2. In a further implementation the control logic 2 can read the program code from an external program storage via an interface. The memory system 1 as shown in FIG. 5 or 6 can be implemented by a VLSI design. The memory system 1 can be implemented at the lowest costs in terms of silicon area and power consumption. The memory system 1 supports a single read and multiple writes during every clock cycle. In a possible implementation single-port SRAM blocks in VLSI design are used to implement the memory system 1.

What is claimed is:

1. A memory system comprising:
a control logic adapted to receive a number of write requests (WRs) from input ports and to receive a read request (RR) from an output port within a clock cycle of a clock signal (CLK) applied to said memory system, wherein n is a natural number; and
a number of memory banks of a shared memory adapted to store data,
wherein the number of WRs is n,
wherein the number of memory banks is n+1, and
wherein the control logic is adapted to control a memory bank occupancy level (MBOL) of each memory bank such that the differences between MBOLs of the memory banks are minimized;
wherein the control logic further comprises an occupancy level counter (OLC) for each memory bank configured to monitor the MBOL of its respective memory bank.

2. The memory system according to claim 1,
wherein the control logic is adapted to distribute the WRs from the input ports to all available memory banks of the memory system according to a predetermined association function (AF) to achieve a uniform distribution of write accesses to the memory banks.

3. The memory system according to claim 2,
wherein the AF is configured to minimize a correlation between the input ports receiving the WRs and the memory banks controlled by the control logic in response to the WRs.

4. The memory system according to claim 3,
wherein the qualifiers comprise one or more of the group consisting of:
a type of data received from an input port, and
a class of data received from an input port.

5. The memory system according to claim 2,
wherein the AF is configured to minimize a correlation between qualifiers of data received from an input port and written into one of the n+1 memory banks in response to a WR received by the control logic in response to said WR.

6. The memory system according to claim 2,
wherein the WRs from the input ports are distributed to all available memory banks of the shared memory to maintain a uniform distribution of the MBOLs of the memory banks over time.

7. The memory system according to claim 2,
wherein each of the n+1 memory banks has a predetermined maximum memory size B; and wherein a memory size (MS) of the memory system provided by the n+1 memory banks is equal to:

the quantity (n+1)*B if no memory bank of the memory system is fully occupied, the quantity (n+1)*(B−Min) if at least one memory bank is fully occupied and if the number of WRs in the current clock cycle of the CLK is less than or equal to the difference between n+1 and the number of the memory banks ready for write that are fully occupied, wherein Min is the minimum MBOL between the non-fully occupied memory banks.

8. The memory system according to claim 1, wherein WRs from the input ports are distributed to all available memory banks of the shared memory to maintain a uniform distribution of the MBOLs of the memory banks over time.

9. The memory system according to claim 8, wherein the OLC of one of the memory banks of the shared memory is incremented with each write operation writing data into the respective memory bank in response to a write request (WR) received by the control logic from one of the input ports.

10. The memory system according to claim 1, wherein the OLC of one of the memory banks of the shared memory is decremented upon each read operation reading data from the respective memory bank in response to an RR received by the control logic from the output port.

11. The memory system according to claim 1, wherein the memory bank is formed by a single-port static random-access memory (SRAM).

12. The memory system according to claim 1, wherein each of the n+1 memory banks has a predetermined maximum memory size B; and wherein a memory size (MS) of the memory system provided by the n+1 memory banks is equal to:

the quantity (n+1)*B if no memory bank of the memory system is fully occupied;

the quantity (n+1)*(B−Min) if at least one memory bank is fully occupied and if the number of WRs in the current clock cycle of the CLK is less than or equal to the difference between the n+1 and number of the memory banks ready for write that are fully occupied, wherein Min is the minimum MBOL between the non-fully occupied memory banks.

13. The memory system according to claim 1, wherein the AF used by the control logic comprises a random association function, wherein the control logic is adapted to sort all available memory banks for writing data into said memory banks based on their MBOLs and to randomly associate the WRs received by the control logic to the available memory banks starting with the memory bank having the lowest MBOL.

14. The memory system according to claim 13, wherein the AF used by the control logic comprises a random association function with history, wherein the control logic is further adapted to keep a history of WRs from each input port, and to set memory banks not marked in the history in a priority manner from the memory banks sorted based on the MBOLs.

15. An apparatus comprising:

a predetermined number of ports, wherein the predetermined number is equal to N; and a memory system comprising:

a control logic adapted to receive a number of write requests (WRs) from input ports and to receive a read request (RR) from an output port within a clock cycle of a clock signal (CLK) applied to said memory system wherein n is a natural number; and a number of memory banks of a shared memory adapted to store data, wherein the number of WRs is n, wherein the number of memory banks is n+1, and wherein the control logic is adapted to control a memory bank occupancy level (MBOL) of each memory bank such that the differences between MBOLs of the memory banks are minimized;

wherein the control logic further comprises an occupancy level counter (OLC) for each memory bank configured to monitor the MBOL of its respective memory bank.

16. The apparatus according to claim 15, further comprising:

a network bridge;

a network switch;

a network router; and a queuing engine.

* * * * *